US011518923B2

(12) United States Patent
Kodama et al.

(10) Patent No.: US 11,518,923 B2
(45) Date of Patent: Dec. 6, 2022

(54) COOLANT COMPOSITION AND COOLING SYSTEM

(71) Applicant: TOYOTA JIDOSHA KABUSHIKI KAISHA, Toyota (JP)

(72) Inventors: Yasuaki Kodama, Seto (JP); Masao Watanabe, Okazaki (JP); Tomoharu Kataoka, Shizuoka (JP); Daisuke Tokozakura, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/939,348

(22) Filed: Jul. 27, 2020

(65) Prior Publication Data

US 2021/0062062 A1 Mar. 4, 2021

(30) Foreign Application Priority Data

Aug. 26, 2019 (JP) .............................. JP2019-153538

(51) Int. Cl.
*C09K 5/20* (2006.01)
*H05K 7/20* (2006.01)
*C09K 5/10* (2006.01)
*C09K 3/18* (2006.01)
*C09K 5/04* (2006.01)

(52) U.S. Cl.
CPC .................. *C09K 5/20* (2013.01); *C09K 3/18* (2013.01); *C09K 5/04* (2013.01); *C09K 5/10* (2013.01); *H05K 7/20254* (2013.01); *H05K 7/20872* (2013.01)

(58) Field of Classification Search
CPC ... C09K 5/20; C09K 5/10; C09K 5/04; C09K 3/18
See application file for complete search history.

(56) References Cited

U.S. PATENT DOCUMENTS

| 2,281,597 | A | * | 5/1942 | Prutton | ................... C10M 1/08 |
| | | | | | 508/578 |
| 3,909,431 | A | * | 9/1975 | Figiel | ....................... C10M 3/00 |
| | | | | | 508/577 |
| 4,081,389 | A | * | 3/1978 | Swinney | ............... C10M 129/24 |
| | | | | | 508/578 |
| 5,300,245 | A | * | 4/1994 | Sawada | .................. C09K 5/045 |
| | | | | | 252/68 |
| 6,197,211 | B1 | * | 3/2001 | Nakajima | ............... C09K 5/042 |
| | | | | | 252/68 |
| 6,415,614 | B1 | * | 7/2002 | Greenfield | ............. C09K 5/041 |
| | | | | | 62/112 |
| 2003/0034477 | A1 | * | 2/2003 | Minor | .................. C10M 145/36 |
| | | | | | 252/68 |

(Continued)

FOREIGN PATENT DOCUMENTS

| CN | 1235184 A | 11/1999 |
| CN | 1914292 A | 2/2007 |

(Continued)

*Primary Examiner* — Jane L Stanley
(74) *Attorney, Agent, or Firm* — Dickinson Wright, PLLC

(57) ABSTRACT

This disclosure provides a nonaqueous coolant composition excellent in insulation property, heat transfer characteristic, and hydrolysis resistance. The embodiment is a coolant composition that includes at least one ketone compound having 6 or more carbon atoms as a nonaqueous base and is substantially free of water.

15 Claims, 1 Drawing Sheet

(56) References Cited

U.S. PATENT DOCUMENTS

| | | | |
|---|---|---|---|
| 2003/0209688 A1* | 11/2003 | Lee | C10M 101/02 252/68 |
| 2004/0041122 A1* | 3/2004 | Minor | C10M 171/008 252/67 |
| 2004/0222402 A1* | 11/2004 | Minor | C10M 131/04 252/68 |
| 2005/0109979 A1* | 5/2005 | Egawa | H01M 8/04029 252/73 |
| 2005/0188697 A1 | 9/2005 | Zyhowski et al. | |
| 2006/0243945 A1* | 11/2006 | Minor | A62D 1/0057 252/67 |
| 2007/0104988 A1 | 5/2007 | Nishii et al. | |
| 2010/0000146 A1* | 1/2010 | Boot | C10L 10/06 44/349 |
| 2021/0316590 A1* | 10/2021 | Fuse | B60H 1/323 |
| 2022/0033700 A1* | 2/2022 | Kodama | H05K 7/20872 |
| 2022/0131205 A1* | 4/2022 | Champagne | H01M 10/0525 |
| 2022/0228047 A1* | 7/2022 | Prentice | H01M 10/613 |
| 2022/0259476 A1* | 8/2022 | Short | H01M 10/625 |
| 2022/0267658 A1* | 8/2022 | Kramer | C10M 169/04 |

FOREIGN PATENT DOCUMENTS

| | | |
|---|---|---|
| CN | 1950478 A | 4/2007 |
| CN | 1957055 A | 5/2007 |
| CN | 103351849 A | 10/2013 |
| CN | 107126660 A | 9/2017 |
| EP | 3421105 A1 | 1/2019 |
| JP | H05163499 A | 6/1993 |
| JP | H07150160 A | 6/1995 |
| JP | 2005203148 A | 7/2005 |
| JP | 2013006944 A | 1/2013 |
| JP | 2017017228 A | 1/2017 |
| JP | 2017054965 A | 3/2017 |
| WO | 2005078046 A1 | 8/2005 |
| WO | 2009114398 A1 | 9/2009 |

* cited by examiner

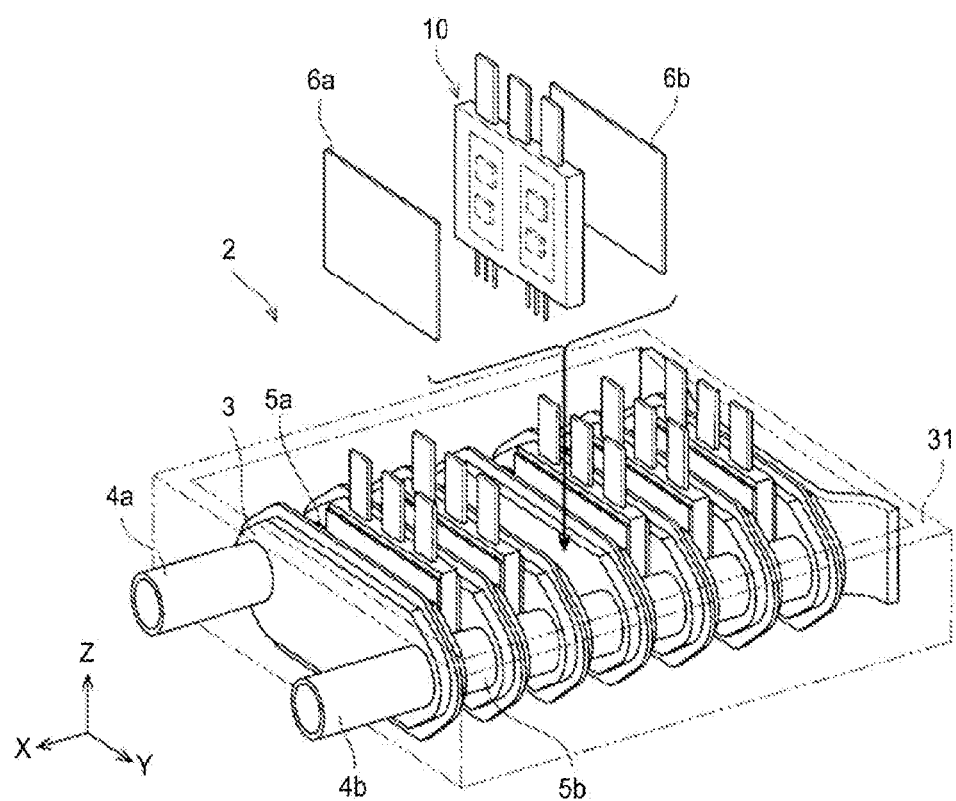

COOLANT COMPOSITION AND COOLING SYSTEM

CROSS REFERENCE TO RELATED APPLICATIONS

The present application claims priority from Japanese patent application JP 2019-153538 filed on Aug. 26, 2019, the entire content of which is hereby incorporated by reference into this application.

BACKGROUND

Technical Field

The present disclosure relates to a coolant composition and a cooling system that use the coolant composition.

Background Art

A vehicle with traction motor, such as a hybrid vehicle and an electric vehicle, includes a power control unit (PCU) for appropriately controlling an electric power. The PCU includes an inverter that drives the motor, a boost converter that controls a voltage, a DC/DC converter that steps down a high voltage, and the like. The inverter or the converter includes a power card as a card-type power module that includes semiconductor devices, and the power card generates a heat caused by its switching action. Therefore, the inverter and the converter are equipment that possibly becomes to have a high temperature due to the heat generation. Heat generation equipment in the vehicle with traction motor includes a battery in addition to the inverter and the converter. Accordingly, the vehicle with traction motor includes a cooling system for cooling the inverter, the converter, the battery, and the like.

For example, JP 2017-017228 A discloses a configuration of a semiconductor apparatus used for an inverter of a drive system in a vehicle with traction motor (for example, an electric vehicle or a hybrid vehicle) (FIG. 1). A semiconductor apparatus 2 of FIG. 1 is a unit where a plurality of power cards 10 and a plurality of coolers 3 are stacked. In FIG. 1, reference numeral 10 is attached to only one power card, and reference numerals to the other power cards are omitted. For showing the whole semiconductor apparatus 2, a case 31, which houses the semiconductor apparatus 2, is illustrated by dotted lines. The one power card 10 is sandwiched between the two coolers 3. An insulating plate 6a is sandwiched between the power card 10 and one of the coolers 3, and an insulating plate 6b is sandwiched between the power card 10 and the other of the coolers 3. Greases are applied between the power card 10 and the insulating plates 6a and 6b. Greases are applied also between the insulating plates 6a and 6b and the coolers 3. For easy understanding, FIG. 1 illustrates the one power card 10 and the insulating plates 6a and 6b extracted from the semiconductor apparatus 2. The power card 10 houses a semiconductor device. The power card 10 is cooled by a refrigerant passing through the cooler 3. The refrigerant is a liquid, typically water. The power cards 10 and the coolers 3 are alternately stacked, and the coolers 3 are positioned at both ends in a stacking direction of the unit. The plurality of coolers 3 are coupled by coupling pipes 5a and 5b. A refrigerant supply pipe 4a and a refrigerant discharge pipe 4b are coupled to the cooler 3 positioned at the one end in the stacking direction of the unit. The refrigerant supplied through the refrigerant supply pipe 4a is distributed to every cooler 3 through the coupling pipes 5a. The refrigerant absorbs the heat from the adjacent power card 10 while passing through each cooler 3. The refrigerant that has passed through each cooler 3 passes through the coupling pipe 5b and is discharged from the refrigerant discharge pipe 4b.

Meanwhile, JP 2005-203148 A discloses a coolant that includes a nonaqueous base, and the nonaqueous base specifically includes alkyl benzene, dimethyl silicone, and perfluorocarbon.

SUMMARY

As the configuration of the semiconductor apparatus disclosed in JP 2017-017228 A, generally, the refrigerant circulates near the power cards and the batteries. Therefore, in the vehicle with traction motor, such as the hybrid vehicle and the electric vehicle, when the coolant leaks due to an accident, the leaked refrigerant possibly contacts a terminal of the power card, the battery, or the like to cause a short circuit. Therefore, from an aspect to reduce the occurrence of the secondary accident in the case of the refrigerant leakage, the refrigerant is desired to have an excellent insulation property. JP 2005-203148 A uses a silicone oil, such as dimethyl silicone, and the silicone oil is excellent from the aspect of the insulation property. However, the silicone oil is significantly low in cooling performance compared with an aqueous refrigerant.

A cooling system in which a coolant composition is housed includes, for example, a refrigerant pipe through which the coolant composition as a refrigerant flows, a reservoir tank that houses the coolant composition, and various members or devices, such as a circulation device for circulating the coolant composition in a circulation passage. However, it is difficult to completely block contact between the coolant composition and external air, and water included in the external air enters the coolant composition. For example, at a connecting portion between members, the external air including water enters the coolant composition. When the water enters the coolant composition, components in the coolant composition are hydrolyzed by the water, the property (for example, insulation property) of the coolant composition possibly changes. Therefore, the coolant composition is desired to have hydrolysis resistance where hydrolyzation is less likely to occur.

Therefore, the present disclosure provides a nonaqueous coolant composition excellent in insulation property, heat transfer characteristic, and hydrolysis resistance.

Exemplary aspects of the embodiment will be described as follows.

(1) A coolant composition that comprises at least one ketone compound having 6 or more carbon atoms as a nonaqueous base. The coolant composition is substantially free of water.
(2) The coolant composition according to (1) wherein the ketone compound comprises at least one selected from the group consisting of an aliphatic ketone compound, an alicyclic ketone compound, and an aromatic ketone compound.
(3) The coolant composition according to (1) wherein the ketone compound comprises at least one aliphatic ketone compound.
(4) The coolant composition according to (1) wherein the ketone compound comprises at least one alicyclic ketone compound.
(5) The coolant composition according to (1) wherein the ketone compound comprises at least one aromatic ketone compound.
(6) The coolant composition according to any one of (1) to (5) wherein the ketone compound has 6 to 14 carbon atoms.

(7) The coolant composition according to any one of (1) to (6) wherein a content of the ketone compound in the coolant composition is 10 mass % or more.
(8) The coolant composition according to any one of (1) to (7) that further comprises a mineral oil.
(9) The coolant composition according to (8) wherein a content of the ketone compound in the coolant composition is 10 to 90 mass %, and a content of the mineral oil in the coolant composition is 10 to 90 mass %.
(10) The coolant composition according to (8) wherein a content of the ketone compound in the coolant composition is 30 to 70 mass %, and a content of the mineral oil in the coolant composition is 30 to 70 mass %.
(11) The coolant composition according to any one of (1) to (10) wherein a conductivity at 20° C. is 0.1 µS/cm or less.
(12) The coolant composition according to any one of (1) to (11) wherein a conductivity at 20° C. is 0.001 µS/cm or less.
(13) A cooling system that uses the coolant composition according to any one of (1) to (12) as a refrigerant.
(14) The cooling system according to claim (13) for cooling heat generation equipment mounted to a vehicle with traction motor.
(15) The cooling system according to (14) wherein the heat generation equipment is an inverter, a converter, a generator, a motor, or a battery.
(16) The cooling system according to (14) or (15) wherein the heat generation equipment includes a power card, and the coolant composition is in physical contact with the power card.

The present disclosure can provide the nonaqueous coolant composition excellent in insulation property, heat transfer characteristic, and hydrolysis resistance.

BRIEF DESCRIPTION OF THE DRAWINGS

FIG. 1 is a schematic perspective view illustrating an exemplary configuration of a semiconductor apparatus used for an inverter of a drive system in a vehicle with traction motor.

DETAILED DESCRIPTION

1. Coolant Composition

The embodiment is a coolant composition that comprises at least one ketone compound having 6 or more carbon atoms as a nonaqueous base and is substantially free of water.

The coolant composition according to the embodiment is excellent in insulation property, heat transfer characteristic, and hydrolysis resistance. Especially, since the coolant composition according to the embodiment is extremely excellent in insulation property, a secondary accident, such as a short circuit, can be suppressed when the coolant composition leaks due to an accident or the like. Therefore, the coolant composition according to the embodiment is usable in a vehicle with traction motor, such as a hybrid vehicle and an electric vehicle in some embodiments. Furthermore, since the coolant composition according to the embodiment is excellent in hydrolysis resistance, a property (for example, insulation property) of the coolant composition is less likely to change even when water enters the coolant composition from external air.

The coolant composition according to the embodiment provides another effect as follows. Conventionally, a typically used ethylene glycol based aqueous coolant has an excellent heat transfer characteristic but has a poor insulation property. Therefore, as illustrated in FIG. 1, a component side of a cooling object needed to have an insulation structure. Specifically, as illustrated in FIG. 1, it was necessary to dispose the insulating plates (6a and 6b of FIG. 1) to ensure the insulation between the electronic equipment and the coolant composition. However, disposing the insulating plates degrades the heat transfer characteristic between the coolant composition and the electronic equipment, thus consequently reducing the cooling performance. Since the coolant composition according to the embodiment is excellent in insulation property, the disposing of the insulating plates can be eliminated, and as a result, a cooling system excellent in cooling performance can be provided.

The coolant composition according to the embodiment provides another effect as follows. As an exemplary means for cooling the electronic equipment, there has been a method to at least partially (partially or completely) immerse the electronic equipment in the coolant composition. For example, for the cooling, the power card can be disposed to be in physical contact with the coolant composition. While this cooling structure has an extremely excellent heat transfer efficiency, the coolant composition requires the extremely excellent insulation property because the electronic equipment and coolant composition are in direct contact. The coolant composition according to the embodiment is extremely excellent in insulation property, non-toxic, and less likely to cause corrosion. Thus, the coolant composition according to the embodiment is usable in the cooling system that has this cooling structure in some embodiments.

The coolant composition according to the embodiment includes the nonaqueous base as the component and is substantially free of water.

In this description, "substantially free of water" means that the coolant composition does not include water in a content range in which expression of the effect of the embodiment is interfered, may mean that the water content in the coolant composition is 1.0 mass % or less, may mean that the water content in the coolant composition is 0.5 mass % or less, may mean that the water content in the coolant composition is 0.1 mass % or less, or may mean that the water content in the coolant composition is 0 mass % (undetectable).

The coolant composition according to the embodiment includes at least one ketone compound having 6 or more carbon atoms as the nonaqueous base. The ketone compound having 6 or more carbon atoms is excellent in insulation property, heat transfer characteristic, and hydrolysis resistance. One ketone compound may be used alone, or two or more ketone compounds may be used in combination.

The ketone compound is a compound that has a structure in which two hydrocarbon groups are bonded via a carbonyl group. The ketone compound includes at least one selected from the group consisting of an aliphatic ketone compound, an alicyclic ketone compound, and an aromatic ketone compound. In one embodiment, the ketone compound comprises at least one aliphatic ketone compound. In one embodiment, the ketone compound comprises at least one alicyclic ketone compound. In one embodiment, the ketone compound comprises at least one aromatic ketone compound.

The aliphatic ketone compound may be a saturated aliphatic ketone compound, or may be an unsaturated aliphatic ketone compound. The unsaturated aliphatic ketone compound includes at least one unsaturated bond. The aliphatic ketone compound may be linear, or may be branched chain. At least one of the hydrocarbon groups bonded via the carbonyl group may have a cyclic structure. The aliphatic ketone compound includes, for example, hexanone, methylpentanone, heptanone, methylhexanone, dimethylpentanone, octanone, methylheptanone, dimethylhexanone, nonanone, methyloctanone, dimethylheptanone, decanone, undecanone, dodecanone, tridecanone, cyclopentyl methyl ketone, cyclohexyl methyl ketone, cycloheptyl methyl ketone, cyclooctyl methyl ketone, butenyl methyl ketone, or a mixture of them. The hexanone includes, for example, 2-hexanone, 3-hexanone, 4-hexanone, or a mixture of them. The methylpentanone includes, for example, 4-methyl-2-pentanone. The heptanone includes, for example, 2-heptanone, 3-heptanone, 4-heptanone, or a mixture of them. The methylhexanone includes, for example, 5-methyl-2-hexanone, 5-methyl-3-hexanone, or a mixture of them. The dimethylpentanone includes, for example, 2,4-dimethyl-3-pentanone, 4,4-dimethyl-2-pentanone, or a mixture of them. The octanone includes, for example, 2-octanone, 3-octanone, 4-octanone, or a mixture of them. The methylheptanone includes, for example, 5-methyl-3-heptanone, 6-methyl-2-heptanone, or a mixture of them. The dimethylhexanone includes, for example, 2,5-dimethyl-3-hexanone. The nonanone includes, for example, 2-nonanone, 3-nonanone, 4-nonanone, 5-nonanone, or a mixture of them. The methyloctanone includes, for example, 5-methyl-2-octanone. The dimethylheptanone includes, for example, 2,6-dimethyl-4-heptanone. The decanone includes, for example, 2-decanone, 3-decanone, 4-decanone, 5-decanone, or a mixture of them. The undecanone includes, for example, 2-undecanone, 3-undecanone, 5-undecanone, 6-undecanone, or a mixture of them. The dodecanone includes, for example, 2-dodecanone. The tridecanone includes, for example, 2-tridecanone, 7-tridecanone, or a mixture of them. The butenyl methyl ketone includes, for example, 4-hexen-2-one, 5-hexen-2-one, or a mixture of them. One aliphatic ketone compound may be used alone, or two or more aliphatic ketone compounds may be used in combination.

The alicyclic ketone compound is a ketone compound in which two hydrocarbon groups bonded via a carbonyl group are mutually bonded to form a cyclic structure. The hydrocarbon chain constituting the cyclic structure may be a saturated hydrocarbon chain or may be an unsaturated hydrocarbon chain. The hydrocarbon chain is the saturated hydrocarbon chain in some embodiments. The alicyclic ketone compound includes, for example, cyclohexanone, cycloheptanone, cyclooctanone, trimethylcyclohexanone, or a mixture of them. The trimethylcyclohexanone includes, for example, 3,3,5-trimethylcyclohexanone. One alicyclic ketone compound may be used alone, or two or more alicyclic ketone compounds may be used in combination. The alicyclic ketone compound may have 6 to 8 carbon atoms constituting the ring.

The aromatic ketone compound is a ketone compound where at least one of the two hydrocarbon groups bonded via a carbonyl group includes an aromatic hydrocarbon group. The aromatic ketone compound includes, for example, acetophenone, benzophenone, benzylphenylketone, diphenylacetone, or a mixture of them. The diphenylacetone includes, for example, 1,1-diphenylacetone. One aromatic ketone compound may be used alone, or two or more aromatic ketone compounds may be used in combination.

The ketone compound has 6 or more carbon atoms. The number of carbon atoms of the ketone compound may be 6 to 14, 7 to 13, or 10 to 12 in some embodiments from the aspect of the boiling point, the flash point, and/or the viscosity of the ketone compound.

A content of the ketone compound in the coolant composition is, for example, 10 mass % or more, and may be 30 mass % or more, 40 mass % or more, or 50 mass % or more. By setting the content of the ketone compound to 10 mass % or more, the insulation property, the heat transfer characteristic, and the hydrolysis resistance of the coolant composition can be improved. The content of the ketone compound in the coolant composition is, for example, 100 mass % or less, and may be 90 mass % or less.

The coolant composition according to the embodiment may include another nonaqueous base in addition to the ketone compound. The other nonaqueous base includes, for example, a mineral oil, a synthetic oil, or a mixture of them. The synthetic oil includes, for example, an ester synthetic oil, a synthetic hydrocarbon oil, a silicone oil, a fluorinated oil, or a mixture of them. One of them may be used alone, or two or more may be used in mixture.

The coolant composition according to the embodiment may include the mineral oil as the nonaqueous base in addition to the ketone compound. By including the mineral oil, the insulation property of the coolant composition can be improved. The mineral oil includes, for example, a paraffin mineral oil, a naphthenic mineral oil, or a mixture of them. One base oil may be used alone, or two or more base oils may be used in mixture.

While a kinematic viscosity (40° C.) of the mineral oil is not specifically limited, the kinematic viscosity is, for example, 0.5 to 100 mm$^2$/s, and may be 0.5 to 20 mm$^2$/s or 0.5 to 10 mm$^2$/s.

A content of the mineral oil in the coolant composition may be 10 mass % or more, 20 mass % or more, 30 mass % or more, 40 mass % or more, or 50 mass % or more.

When the coolant composition includes the mineral oil, the content of the ketone compound in the coolant composition is 10 to 90 mass % and the content of the mineral oil in the coolant composition is 10 to 90 mass % in some embodiments. When the coolant composition includes the mineral oil, the content of the ketone compound in the coolant composition is 30 to 70 mass % and the content of the mineral oil in the coolant composition is 30 to 70 mass % in some embodiments. When the coolant composition includes the mineral oil, the content of the ketone compound in the coolant composition is 40 to 60 mass % and the content of the mineral oil in the coolant composition is 40 to 60 mass % in some embodiments.

The coolant composition according to the embodiment may include an optional component, such as an antioxidant agent, a rust inhibitor, a friction modifier, an anticorrosive, a viscosity index improver, a pour point depressant, a dispersing agent/surfactant, an antiwear agent, or a solid lubricant, in addition to the above-described components. A content of the optional component in the coolant composition is, for example, 0.1 to 20 mass %, and may be 10 mass % or less, 5 mass % or less, or 1 mass % or less.

A kinematic viscosity (20° C.) of the coolant composition according to the embodiment is, for example, 0.1 to 100 mm$^2$/s, and may be 0.1 to 10 mm$^2$/s.

Since the coolant composition is forcibly circulated in the cooling system, the viscosity may be lowered. The viscosity of the coolant composition can be adjusted by, for example, a viscosity and an amount of the mineral oil to be added. The kinematic viscosity (40° C.) of the coolant composition according to the embodiment may be 0.1 to 10 mm$^2$/s.

A conductivity (20° C.) of the coolant composition according to the embodiment may be 0.1 μS/cm or less, 0.01 μS/cm or less, or 0.001 μS/cm or less.

2. Cooling System

The coolant composition according to the embodiment is used for the cooling system, and may be used for the cooling system mounted to a vehicle with traction motor. That is, an aspect of the embodiment is a cooling system where the coolant composition according to the embodiment is used as a refrigerant. An aspect of the embodiment is a cooling system for cooling heat generation equipment mounted to a vehicle with traction motor. An aspect of the embodiment is a vehicle with traction motor that includes the cooling system according to the embodiment and heat generation equipment cooled by the cooling system.

The "vehicle with traction motor" in this description includes both an electric vehicle and a hybrid vehicle. The electric vehicle includes only a traction motor as a power source without an engine. The hybrid vehicle includes both the traction motor and the engine as the power source. A fuel cell vehicle is also included in the "vehicle with traction motor."

As one of the environmental measures, the vehicle with traction motor, such as the hybrid vehicle, the fuel cell vehicle, and the electric vehicle, that travels by a driving force of the motor has attracted attention. In this vehicle, since the heat generation equipment, such as a motor, a generator, an inverter, a converter, and a battery, becomes to have a high temperature due to the heat generation, the heat generation equipment needs to be cooled. As described above, the coolant composition according to the embodiment is excellent in insulation property and heat transfer characteristic, and a secondary accident, such as a short circuit, is less likely to occur even when the coolant composition leaks due to an accident or the like. Therefore, the coolant composition according to the embodiment is usable for the cooling system of the vehicle with traction motor in some embodiments. Since the coolant composition according to the embodiment is excellent in hydrolysis resistance as described above, the property (for example, insulation property) of the coolant composition is less likely to change even when water enters the coolant composition from external air.

The cooling system includes, for example, a refrigerant pipe through which the coolant composition as a refrigerant flows, a reservoir tank that houses the coolant composition, a circulation device for circulating the coolant composition in a circulation passage, or a cooling device for decreasing the temperature of the coolant composition. The circulation device includes, for example, an electric pump. The cooling device includes, for example, a radiator, a chiller, or an oil cooler. A cooling object for the cooling device is the heat generation equipment, such as the inverter, the converter, the generator, the motor, and the battery.

The configuration of the cooling system is not specifically limited. The cooling system includes, for example, the refrigerant pipe, the reservoir tank, the electric pump, the radiator, and a cooling unit included in the heat generation equipment. The cooling unit is a unit to receive a heat from the heat generation equipment, and for example, the cooler 3 of FIG. 1 corresponds to the cooling unit. For example, after the coolant composition is pumped up from the reservoir tank by the electric pump, the heat generation equipment is cooled by the cooling unit, and subsequently, the coolant composition is returned to the reservoir tank via the radiator on a downstream side. Since the temperature of the coolant composition that has cooled the cooling unit increases, the temperature of the coolant composition that has increased in temperature is decreased by the radiator. A configuration where the oil cooler is disposed on the way of the refrigerant pipe to cool the motor by this oil cooler can be employed.

The cooling system according to the embodiment may be used for the vehicle with traction motor. That is, an aspect of the embodiment is a vehicle with traction motor that includes the cooling system according to the embodiment. An aspect of the embodiment is an electric vehicle, a hybrid vehicle, or a fuel cell vehicle that includes the cooling system according to the embodiment.

As described above, the coolant composition according to the embodiment is extremely excellent in insulation property, non-toxic, and less likely to cause corrosion. Thus, the coolant composition according to the embodiment is usable for the cooling system that has a cooling structure where the electronic equipment is at least partially (partially or completely) immersed in the coolant composition in some embodiments. The electronic equipment includes a power card, a CPU, and the like, which include semiconductor devices. Specific configurations of this cooling system can be found in U.S. Pat. No. 7,403,392 or US Patent Application Publication No. 2011-0132579 A. Specifically, an aspect of the embodiment is the vehicle with traction motor where the heat generation equipment includes the power card, and the coolant composition is in physical contact with the power card.

EXAMPLES

While the following describes the embodiment with examples, the disclosure is not limited to the examples.
<Material>
2-octanone (manufactured by Tokyo Chemical Industry)
2,6-dimethyl-4-heptanone (manufactured by Tokyo Chemical Industry)
3,3,5-trimethylcyclohexanone (manufactured by Tokyo Chemical Industry)
Mineral oil: kinematic viscosity (20° C.) 0.1 to 10 mm$^2$/s
Conventional LLC (Toyota genuine, product name: Super Long-Life Coolant, including ethylene glycol and additive)
Ethylene glycol (manufactured by Tokyo Chemical Industry) (hereinafter also referred to as EG)
Ion exchanged water
<Preparation Method>
Respective coolant compositions were prepared with compositions described in Table 1-1 to Table 1-3 below.
<Conductivity>
The conductivities of the respective coolant compositions at 20° C. were measured using a conductivity measuring machine (manufactured by Yokogawa Electric Corporation, SC72 Personal Handheld Conductivity Meter, sensor: SC72SN-11). Table 1-1 to Table 1-3 indicate the results.
<Heat Transfer Characteristic>
The heat transfer characteristics of the respective coolant compositions were compared by calculating the cooling performances of the radiator, the oil cooler, and the inverter, which used the respective coolant compositions as the refrigerants, with formulas below. Table 1-1 to Table 1-3 indicate the results.
(Cooling Performance in Radiator)
The cooling performances in the radiators using the respective coolant compositions as the refrigerants were calculated with the formula below. The refrigerants were adjusted to have inlet temperatures at 65° C. Other conditions were as follows. Ventilation volume to radiator: 4.5 m/sec, refrigerant flow rate: 10 L/min, temperature difference between refrigerant and external air: 40° C. (refrigerant: 65° C., external air: 25° C.).

$$Q_w = \frac{V_w \cdot \gamma_w \cdot 10^{-3}}{60} \cdot C_{pw} \cdot (t_{w1} - t_{w2}) \quad \text{[Math. 1]}$$

$Q_W$: cooling performance, $V_W$: refrigerant flow rate, $\gamma_W$: refrigerant density, $C_{PW}$: refrigerant specific heat, $t_{W1}$: refrigerant inlet temperature, $t_{W2}$: refrigerant outlet temperature (Cooling Performance in Oil Cooler)

The cooling performances in the oil coolers using the respective coolant compositions as the refrigerants were calculated with the formula below. The refrigerants were adjusted to have the inlet temperatures at 30° C. Other conditions were as follows. Transmission oil flow rate: 6 L/min, refrigerant flow rate: 10 L/min, temperature difference between transmission oil and refrigerant: 30° C. (transmission oil: 60° C., refrigerant: 30° C.).

$$Q_w = \frac{V_w \cdot \gamma_w \cdot 10^{-3}}{60} \cdot C_{pw} \cdot (t_{w1} - t_{w2}) \quad \text{[Math. 2]}$$

$Q_W$: cooling performance, $V_W$: refrigerant flow rate, $\gamma_W$: refrigerant density, $C_{PW}$: refrigerant specific heat, $t_{W1}$: refrigerant inlet temperature, $t_{W2}$: refrigerant outlet temperature (Cooling Performance in Inverter)

The cooling performances in the inverters using the respective coolant compositions as the refrigerants were calculated with the formula below. The refrigerants were adjusted to have the inlet temperatures at 65° C. Other conditions were as follows. Heat generation amount of inverter (power card): 500 W, refrigerant flow rate: 10 L/min.

$$Q_w = \frac{V_w \cdot \gamma_w \cdot 10^{-3}}{60} \cdot C_{pw} \cdot (t_{w1} - t_{w2}) \quad \text{[Math. 3]}$$

$Q_W$: cooling performance, $V_W$: refrigerant flow rate, $\gamma_W$: refrigerant density, $C_{PW}$: refrigerant specific heat, $t_{W1}$: refrigerant inlet temperature, $t_{W2}$: refrigerant outlet temperature <Hydrolysis Resistance>

The respective coolant compositions were put into heat-resistant bottles, water was added so as to be 5% relative to the total mass, and subsequently, heating was performed at 120° C. for 216 hours. Subsequently, the conductivities of the coolant compositions were measured, and occurrence of a hydrolysis reaction was determined from an existence of increase in conductivity. A case where the increase in conductivity was not observed was evaluated as "good" and a case where the increase in conductivity was observed was evaluated as "poor."

TABLE 1-1

|  | Component | Example 1 | Example 2 | Example 3 | Example 4 | Example 5 | Example 6 |
|---|---|---|---|---|---|---|---|
| Compostion (mass %) | 2-Octanone | 100 | — | — | 50 | — | — |
|  | 2,6-Dimethyl-4-Heptanone | — | 100 | — | — | 50 | — |
|  | 3,3,5-Trimethylcyclohexanone | — | — | 100 | — | — | 50 |
|  | Conventional LLC (EG + Additive) | — | — | — | — | — | — |
|  | Ethylene Glycol | — | — | — | — | — | — |
|  | Mineral Oil | — | — | — | 50 | 50 | 50 |
|  | Ion Exchanged Water | — | — | — | — | — | — |
|  | Diethyl Succinate | — | — | — | — | — | — |
|  | Sum | 100 | 100 | 100 | 100 | 100 | 100 |
| Evaluation | Conductivity | <0.0009 | <0.0009 | <0.0009 | <0.0009 | <0.0009 | <0.0009 |
|  | Cooling Performance (Radiator) | 236 | 236 | 225 | 213 | 213 | 211 |
|  | Cooling Performance (Oil Cooler) | 77 | 77 | 80 | 75 | 75 | 77 |
|  | Cooling Performance (Inverter) | 5.8 | 5.8 | 5.8 | 5.5 | 5.5 | 5.6 |
|  | Hydrolysis Resistance | Good <0.0009 | Good <0.0009 | Good <0.0009 | Good <0.0009 | Good <0.0009 | Good <0.0009 |

TABLE 1-2

|  | Component | Example 7 | Example 8 | Example 9 |
|---|---|---|---|---|
| Composition (mass %) | 2-Octanone | 10 | — | — |
|  | 2,6-Dimethyl-4-Heptanone | — | 10 | — |
|  | 3,3,5-Trimethylcyclohexanone | — | — | 10 |
|  | Conventional LLC (EG + Additive) | — | — | — |
|  | Ethylene Glycol | — | — | — |
|  | Mineral Oil | 90 | 90 | 90 |
|  | Ion Exchanged Water | — | — | — |
|  | Diethyl Succinate | — | — | — |
|  | Sum | 100 | 100 | 100 |
| Evaluation | Conductivity | <0.0009 | <0.0009 | <0.0009 |
|  | Cooling Performance (Radiator) | 204 | 204 | 204 |
|  | Cooling Performance (Oil Cooler) | 74 | 74 | 74 |

TABLE 1-2-continued

| Component | Example 7 | Example 8 | Example 9 |
|---|---|---|---|
| Cooling Performance (Inverter) | 5.5 | 5.5 | 5.5 |
| Hydrolysis Resistance | Good <0.0009 | Good <0.0009 | Good <0.0009 |

TABLE 1-3

| | Component | Comparative Example 1 | Comparative Example 2 | Comparative Example 3 | Comparative Example 4 | Comparative Example 5 |
|---|---|---|---|---|---|---|
| Compostion (mass %) | 2-Octanone | — | — | — | — | — |
| | 2,6-Dimethyl-4-Heptanone | — | — | — | — | — |
| | 3,3,5-Trimethylcyclohexanone | — | — | — | — | — |
| | Conventional LLC (EG + Additive) | 50 | — | — | — | — |
| | Ethylene Glycol | — | 50 | — | — | — |
| | Mineral Oil | — | — | 100 | — | — |
| | Ion Exchanged Water | 50 | 50 | — | 100 | — |
| | Diethyl Succinate | — | — | — | — | 100 |
| | Sum | 100 | 100 | 100 | 100 | 100 |
| Evaluation | Conductivity | 7000 | 0.6 | <0.0009 | 0.3 | <0.1 |
| | Cooling Performance (Radiator) | 371 | 368 | 197 | 458 | 198 |
| | Cooling Performance (Oil Cooler) | 115 | 114 | 73 | 124 | 132 |
| | Cooling Performance (Inverter) | 7.1 | 7.0 | 5.4 | 7.7 | 6.1 |
| | Hydrolysis Resistance | — | — | Good | — | Poor |
| | | 7000 | 3.1 | <0.0009 | 0.3 | 1.3 |

The coolant composition of any example had the conductivity less than 0.0009 µS/cm, and was extremely excellent in insulation property. Meanwhile, in comparative examples 1, 2 and 4 that had configurations of conventional coolant compositions (mixture of ethylene glycol and water, or water alone), the conductivities were high and the insulation properties were insufficient. For the hydrolysis resistances of the comparative examples 1, 2, and 4, since the conductivities before the test were high, the evaluations of "good" or "poor" were not given. The coolant composition of any example had the sufficient cooling performance required for a product. Especially, as the content of the ketone compound increased, the cooling performance was improved. Furthermore, the coolant composition of any example was excellent in hydrolysis resistance. Accordingly, it was proved that the coolant compositions according to the embodiment were excellent in insulation property, heat transfer characteristic, and hydrolysis resistance.

Throughout the present specification, it should be understood that the singular forms also include the plural concept unless specifically stated otherwise. Thus, it should be understood that singular articles (for example, "a", "an", "the", or the like in the case of English) also include the plural concept unless otherwise stated.

Upper limit values and/or lower limit values of respective numerical ranges described in this description can be appropriately combined to specify an intended range. For example, upper limit values and lower limit values of the numerical ranges can be appropriately combined to specify an intended range, upper limit values of the numerical ranges can be appropriately combined to specify an intended range, and lower limit values of the numerical ranges can be appropriately combined to specify an intended range.

While the embodiment has been described in detail, the specific configuration is not limited to the embodiment. Design changes within a scope not departing from the gist of the disclosure are included in the disclosure.

What is claimed is:

1. A method of cooling heat generating equipment mounted to a vehicle comprising the steps of:
   cooling heat generation equipment mounted to a vehicle with a coolant composition consisting of:
   at least one ketone compound having 6 or more carbon atoms as a nonaqueous base, a mineral oil, and at least one additive component selected from the group consisting of an antioxidant agent, a rust inhibitor, a friction modifier, an anticorrosive, a viscosity index improver, a pour point depressant, a dispersing agent/surfactant, an antiwear agent, and a solid lubricant,
   wherein a content of the ketone compound in the coolant composition is 30 to 70 mass %,
   wherein a content of the mineral oil in the coolant composition is 30 to 70 mass %,
   wherein the coolant composition is substantially free of water; and
   wherein a kinematic viscosity of the mineral oil at 20° C. is 0.1 to 10 mm$^2$/s, and
   wherein said additive component is included in an amount of 0.1 to 20 mass %.

2. The method according to claim 1,
   wherein the ketone compound comprises at least one selected from the group consisting of an aliphatic ketone compound, an alicyclic ketone compound, and an aromatic ketone compound,
   wherein the aliphatic ketone compound has a structure in which two aliphatic hydrocarbon groups are bonded via one carbonyl group,
   wherein the alicyclic ketone compound has a structure in which two aliphatic hydrocarbon groups are bonded via one carbonyl group, and the two aliphatic hydrocarbon groups are mutually bonded to form a cyclic structure, and
   wherein the aromatic ketone compound has a structure in which two hydrocarbon groups are bonded via one carbonyl group, and at least one of the two hydrocarbon groups includes an aromatic hydrocarbon group.

3. The method according to claim 2,
wherein the ketone compound comprises at least one aliphatic ketone compound, and
wherein the two aliphatic hydrocarbon groups of the aliphatic ketone compound are independently a saturated hydrocarbon chain.

4. The method according to claim 3, wherein the aliphatic ketone compound is at least one selected from the group consisting of hexanone, methylpentanone, heptanone, methylhexanone, dimethylpentanone, octanone, methylheptanone, dimethylhexanone, nonanone, methyloctanone, dimethylheptanone, decanone, undecanone, dodecanone, tridecanone, cyclopentyl methyl ketone, cyclohexyl methyl ketone, cycloheptyl methyl ketone, cyclooctyl methyl ketone, butenyl methyl ketone, and a mixture of them.

5. The method according to claim 2,
wherein the ketone compound comprises at least one alicyclic ketone compound, and
wherein the two aliphatic hydrocarbon groups of the aliphatic ketone compound are independently a saturated hydrocarbon chain.

6. The method according to claim 5, wherein the alicyclic ketone compound is at least one selected from the group consisting of cyclohexanone, cycloheptanone, cyclooctanone, trimethylcyclohexanone, and a mixture of them.

7. The method according to claim 2,
wherein the ketone compound comprises at least one aromatic ketone compound.

8. The method according to claim 7, wherein the aromatic ketone compound is at least one selected from the group consisting of acetophenone, benzophenone, benzylphenylketone, diphenylacetone, and a mixture of them.

9. The method according to claim 1,
wherein the ketone compound has 6 to 14 carbon atoms.

10. The method according to claim 1,
wherein a conductivity at 20° C. is 0.1 μS/cm or less.

11. The method according to claim 1,
wherein a conductivity at 20° C. is 0.001 μS/cm or less.

12. The method according to claim 1,
wherein the heat generation equipment is an inverter, a converter, a generator, a motor, or a battery.

13. The method according to claim 1,
wherein the heat generation equipment includes a power card, and the coolant composition is in physical contact with the power card.

14. The method according to claim 1, wherein the kinematic viscosity of the coolant composition at 20° C. is 0.1 to 10 $mm^2/s$.

15. The method according to claim 1, wherein the additive component is selected from the group consisting of a viscosity index improver, a pour point depressant, a dispersing agent/surfactant, and a solid lubricant.

* * * * *